(12) United States Patent
Chen

(10) Patent No.: US 11,609,467 B2
(45) Date of Patent: Mar. 21, 2023

(54) ANTI-STRESS LIQUID CRYSTAL DISPLAY STRUCTURE HAVING MOVABLE PILLAR-SHAPED SUPPORTING ELEMENT AND MANUFACTURING METHOD THEREOF

(71) Applicant: TCL CHINA STAR OPTOELECTRONICS TECHNOLOGY CO., LTD., Shenzhen (CN)

(72) Inventor: Jing Chen, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 483 days.

(21) Appl. No.: 16/627,821

(22) PCT Filed: Dec. 24, 2019

(86) PCT No.: PCT/CN2019/127781
§ 371 (c)(1),
(2) Date: Dec. 31, 2019

(87) PCT Pub. No.: WO2021/114393
PCT Pub. Date: Jun. 17, 2021

(65) Prior Publication Data
US 2022/0004038 A1    Jan. 6, 2022

(30) Foreign Application Priority Data

Dec. 12, 2019    (CN) .......................... 201911270892.6

(51) Int. Cl.
*G02F 1/1368*    (2006.01)
*G02F 1/1362*    (2006.01)
(Continued)

(52) U.S. Cl.
CPC .......... *G02F 1/1368* (2013.01); *G02F 1/1339* (2013.01); *G02F 1/13394* (2013.01);
(Continued)

(58) Field of Classification Search
CPC combination set(s) only.
See application file for complete search history.

(56) References Cited

U.S. PATENT DOCUMENTS

2006/0070992 A1    4/2006  Weber
2007/0126958 A1*   6/2007  Kim .................. G02F 1/133555
                                                        349/114
(Continued)

FOREIGN PATENT DOCUMENTS

CN    1940659 A    4/2007
CN    101196652 A  6/2008
(Continued)

*Primary Examiner* — Lauren Nguyen
(74) *Attorney, Agent, or Firm* — PV IP PC; Wei Te Chung; Ude Lu

(57) ABSTRACT

An anti-stress liquid crystal display structure and a manufacturing method are provided. The anti-stress liquid crystal display structure includes a first substrate, a plurality of thin film transistors, a second substrate, a plurality of pillar-shaped supporting elements, and a liquid crystal layer. The plurality of thin film transistors have a protection layer and include at least one first protruding part and at least one first concave part. One end of each of the pillar-shaped supporting elements is connected to the second substrate, and other end of each of the pillar-shaped supporting elements includes at least one second protruding part and at least one second concave part and is disposed on the protection layer of each of the thin film transistors. The liquid crystal layer is disposed between the first substrate and the second substrate.

16 Claims, 8 Drawing Sheets

(51) Int. Cl.
*H01L 29/66* (2006.01)
*H01L 29/786* (2006.01)
*G02F 1/1339* (2006.01)
*G02F 1/161* (2006.01)
*G02F 1/153* (2006.01)

(52) U.S. Cl.
CPC .... *G02F 1/13396* (2021.01); *G02F 1/136222* (2021.01); *G02F 1/161* (2013.01); *H01L 29/6675* (2013.01); *H01L 29/78618* (2013.01); *H01L 29/78663* (2013.01); *G02F 2001/1536* (2013.01)

(56) References Cited

U.S. PATENT DOCUMENTS

2008/0278645 A1*  11/2008  Park .................. G02F 1/133555
                                                              349/187
2013/0155367 A1*  6/2013  Tomioka ........... G02F 1/136286
                                                              349/155
2016/0154265 A1   6/2016  Cai et al.

FOREIGN PATENT DOCUMENTS

| | | |
|---|---|---|
| CN | 101251690 A | 8/2008 |
| CN | 101303496 A | 11/2008 |
| CN | 101692439 A | 4/2010 |
| CN | 101713895 A | 5/2010 |
| CN | 102591048 A | 7/2012 |
| CN | 102998851 A | 3/2013 |
| CN | 103676259 A | 3/2014 |
| CN | 104330925 A | 2/2015 |
| CN | 106019670 A | 10/2016 |
| CN | 106873263 A | 6/2017 |
| CN | 108459445 A | 8/2018 |
| KR | 20060057197 A | 5/2006 |
| KR | 20080110060 A | 12/2008 |

* cited by examiner

ANTI-STRESS LIQUID CRYSTAL DISPLAY STRUCTURE HAVING MOVABLE PILLAR-SHAPED SUPPORTING ELEMENT AND MANUFACTURING METHOD THEREOF

FIELD OF INVENTION

The present disclosure relates to the field of display technology, and particularly is an anti-stress liquid crystal display structure with anti-stress ability and a manufacturing method thereof.

BACKGROUND OF INVENTION

Thin film transistor liquid crystal displays (TFT-LCDs) have been widely used. In order to keep uniformity of cell gap, as illustrated in FIG. 1 and FIG. 2, a pillar-shaped supporting element 490 is disposed on a thin film transistor 290 and between a first substrate 190 and a second substrate 390 to support the first substrate 190 and the second substrate 390.

When a TFT-LCD is pressed, liquid crystal molecules 592 usually diffuse. For example, when continuously tapping a panel, diffusion of the liquid crystal molecules 592 may occur. Moreover, a display screen with liquid crystal molecules aligned vertically due to an unique vertical arrangement approach of its liquid crystal molecules 592 makes diffusion of pressed liquid crystal molecules be particular severe.

Reasons of this problem: 1. The panel recovers slowly after receiving an external force and being squeezed. 2. As illustrated in FIG. 2, the pillar-shaped supporting element 490 is squeezed to cause position shifting, and it cannot recover or recovers slowly.

Therefore, an anti-stress liquid crystal display structure and a manufacturing method thereof are necessary to solve the technical problem exists in the prior art.

SUMMARY OF INVENTION

The purpose of the present disclosure is to solve the technical problem that after current liquid crystal display structures receive external and are squeezed, they recover slowly, and pillar-shaped supporting elements are squeezed so that causes position shifting and cannot recover, or recovers slowly.

In order to solve the technical problem mentioned above, one purpose of the present disclosure is to provide an anti-stress liquid crystal display structure with anti-stress ability and a manufacturing method thereof that can use protruding parts and concave parts of pillar-shaped supporting elements and thin film transistors to engage with each other to prevent from the pillar-shaped supporting elements shifting during the panel being squeezed.

Based on the purpose mentioned above, the present disclosure provides an anti-stress liquid crystal display structure, which includes a first substrate, a plurality of thin film transistors, a second substrate, a plurality of pillar-shaped supporting elements, and a liquid crystal layer. The plurality of thin film transistors include a gate electrode, a gate insulating layer, an amorphous silicon layer, an ohmic contact layer, a drain electrode metal layer, a source electrode metal layer, and a protection layer. The gate electrode is disposed on the first substrate. The gate insulating layer is disposed on the gate electrode. The amorphous silicon layer is disposed on the gate insulating layer. The ohmic contact layer is disposed on the amorphous silicon layer. The drain electrode metal layer is disposed on the ohmic contact layer. The source electrode metal layer is disposed on the ohmic contact layer. The protection layer is disposed on the drain electrode metal layer and the source electrode metal layer. The protection layer includes at least one first protruding part and at least one first concave part. One end of each of the pillar-shaped supporting elements is connected to the second substrate, and other end of each of the pillar-shaped supporting elements includes at least one second protruding part and at least one second concave part and is disposed on the protection layer of each of the thin film transistors. The liquid crystal layer is disposed between the first substrate and the second substrate and includes a plurality of liquid crystal molecules. Each of the liquid crystal molecules is aligned along a vertical direction that is from a direction of the first substrate toward a direction of the second substrate.

In an embodiment of the present disclosure, when the second substrate receives a stress toward the first substrate, each of the pillar-shaped supporting elements is engaged on the protection layer.

In an embodiment of the present disclosure, when each of the pillar-shaped supporting elements is engaged on the protection layer, each of the first protruding part and each of the second concave part contact with each other, and each of the second protruding part and each of the first concave part contact with each other.

In an embodiment of the present disclosure, the first substrate includes an alignment film. The alignment film includes a plurality of tilt angles corresponding to a horizontal direction, and the liquid crystal layer is disposed on the plurality of tilt angles.

In an embodiment of the present disclosure, the plurality of pillar-shaped supporting elements include an elastic material or a photoresist material.

In an embodiment of the present disclosure, the first substrate and the second substrate include polarizers and a transparent material.

In an embodiment of the present disclosure, a top surface of the plurality of thin film transistors includes at least one bump.

In an embodiment of the present disclosure, the second substrate includes a light filter layer.

In an embodiment of the present disclosure, the light filter layer includes a red light filter region, a blue light filter region, and a green light filter region.

In an embodiment of the present disclosure, each of the pillar-shaped supporting elements is formed on the light filter layer.

Based on the purpose mentioned above, the present disclosure further provides a manufacturing method of an anti-stress liquid crystal display structure, which includes steps as follows:

Disposing a first substrate.

Forming a plurality of thin film transistors, and forming each of the thin film transistors includes:

Forming a gate electrode on the first substrate.

Forming a gate insulating layer on the gate electrode.

Forming an amorphous silicon layer on the gate insulating layer.

Forming an ohmic contact layer on the amorphous silicon layer.

Forming a drain electrode metal layer on the ohmic contact layer.

Forming a source electrode metal layer on the ohmic contact layer.

Forming a protection layer on the drain electrode metal layer and the source electrode metal layer. Furthermore, the protection layer includes at least one first protruding part and at least one first concave part.

Disposing a second substrate.

Forming a plurality of pillar-shaped supporting elements on the second substrate. Furthermore, one end of each of the pillar-shaped supporting elements is connected to the second substrate, and other end of each of the pillar-shaped supporting elements includes at least one second protruding part and at least one second concave part.

Disposing the other end of each of the pillar-shaped supporting elements on the protection layer of each of the thin film transistors.

The liquid crystal layer is disposed between the first substrate and the second substrate and includes a plurality of liquid crystal molecules. Each of the liquid crystal molecules is aligned along a vertical direction that is from a direction of the first substrate toward a direction of the second substrate.

In an embodiment of the present disclosure, the manufacturing method of the anti-stress liquid crystal display structure of the present disclosure further includes after forming each of the pillar-shaped supporting elements, using an etching approach to form each of the second protruding part and each of the second concave part.

In an embodiment of the present disclosure, the manufacturing method of the anti-stress liquid crystal display structure of the present disclosure further includes using an etching approach to form each of the first protruding part and each of the first concave part on the protection layer.

In an embodiment of the present disclosure, when the second substrate receives a stress toward the first substrate, each of the pillar-shaped supporting elements is engaged on the protection layer.

In an embodiment of the present disclosure, when each of the pillar-shaped supporting elements is engaged on the protection layer, each of the first protruding part and each of the second concave part contact with each other, and each of the second protruding part and each of the first concave part contact with each other.

In an embodiment of the present disclosure, the first substrate includes an alignment film, the alignment film includes a plurality of tilt angles corresponding to a horizontal direction, and the liquid crystal layer is disposed on the plurality of tilt angles.

In an embodiment of the present disclosure, the plurality of pillar-shaped supporting elements include an elastic material or a photoresist material.

In an embodiment of the present disclosure, the first substrate and the second substrate include polarizers and a transparent material.

In an embodiment of the present disclosure, a top surface of the plurality of thin film transistors includes at least one bump.

In an embodiment of the present disclosure, the second substrate includes a light filter layer. The light filter layer includes a red light filter region, a blue light filter region, and a green light filter region, and each of the pillar-shaped supporting elements is formed on the light filter layer.

In order to allow the above contents of the present disclosure to be more obvious and easier to be understood, preferred embodiments of the present disclosure will be described in detail with reference to the accompanying drawings hereinafter.

The beneficial effect of the present disclosure is that the anti-stress liquid crystal display structure and the manufacturing method thereof provided by the present disclosure, which can use protruding parts and concave parts of pillar-shaped supporting elements and thin film transistors to engage with each other to prevent from the pillar-shaped supporting elements shifting during the panel being squeezed.

DETAILED DESCRIPTION OF PREFERRED EMBODIMENTS

Figure 1:
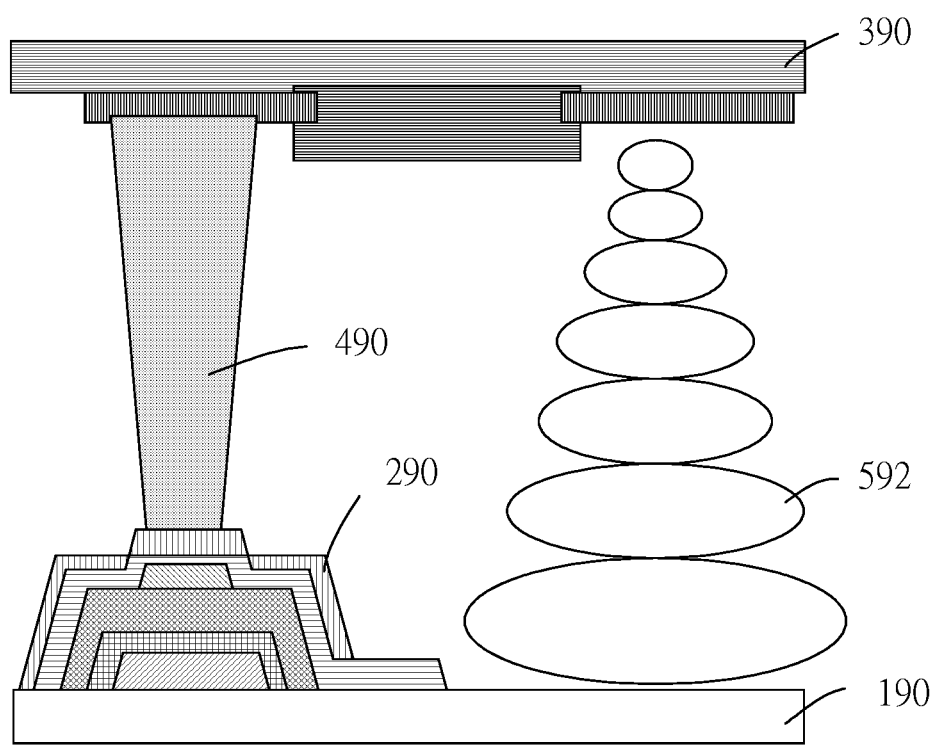
FIG. 1 is a first schematic diagram of a liquid crystal display structure in the prior art.
Figure 2:
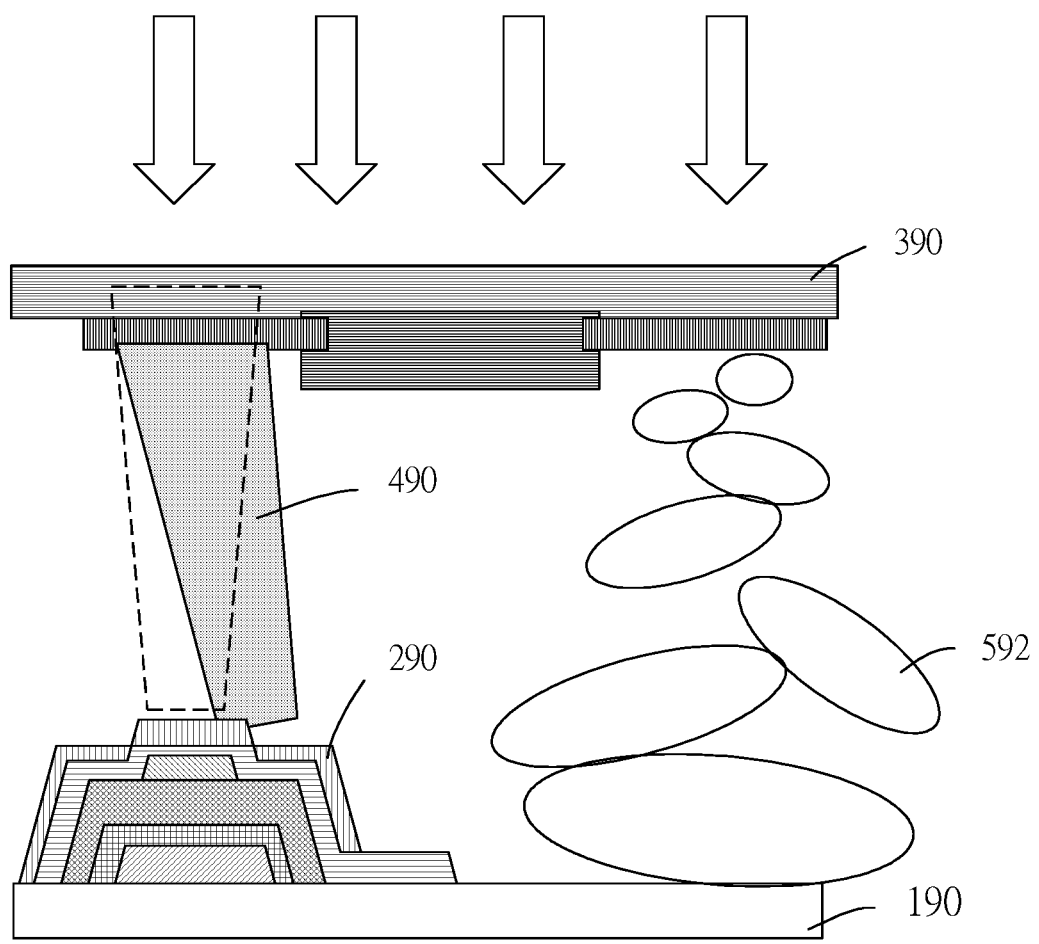
FIG. 2 is a second schematic diagram of the liquid crystal display structure in the prior art.
Figure 3:
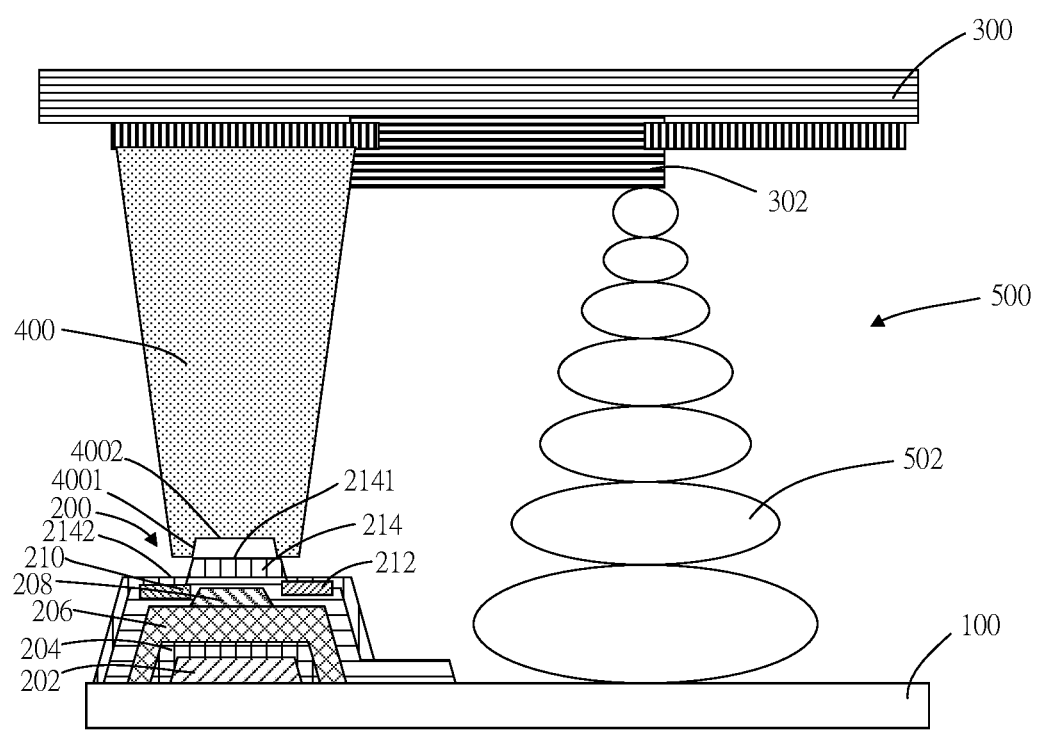
FIG. 3 is a first schematic diagram of an anti-stress liquid crystal display structure of the present disclosure.

In order to allow the above and other purposes, features, and advantages of the present disclosure to be more obvious and easier to understand, preferred embodiments of the present disclosure will be particularly described hereinafter, and with reference to the accompanying drawings, a detailed description will be given below. Furthermore, directional terms described by the present disclosure, such as upper, lower, top, bottom, front, rear, left, right, inner, outer, side, circumference, center, horizontal, lateral, vertical, longitudinal, axial, radial, top layer, bottom layer, etc., are only directions by referring to the accompanying drawings. Therefore, the adopted directional terms are used to describe and understand the present disclosure, but the present disclosure is not limited thereto.

In the figures, units with similar structures are indicated by the same reference numerals.

Please refer to FIG. 3 to FIG. 6, FIG. 3 to FIG. 6 area first to a fourth schematic diagrams of the anti-stress liquid crystal display structure of the present disclosure. The anti-stress liquid crystal display structure of the present disclosure includes a first substrate 100, a plurality of thin film transistors 200, a second substrate 300, a plurality of pillar-shaped supporting elements 400, and a liquid crystal layer 500. The plurality of thin film transistors 200 include a gate electrode 202, a gate insulating layer 204, an amorphous silicon layer 206, an ohmic contact layer 208, a drain electrode metal layer 210, a source electrode metal layer 212, and a protection layer 214.

In an embodiment, the first substrate 100 and the second substrate 300 includes polarizers and a transparent material to make light from a backlight source or light of a lateral light source can successfully pass through to provide image quality that is good and with sufficient brightness to a liquid crystal display.

The gate electrode 202 is disposed on the first substrate 100 to receive a voltage from the first substrate 100 to control the drain electrode metal layer 210 and the source electrode metal layer 212 to turn on. The gate insulating layer 204 is disposed on the gate electrode 202 to lower a leakage current.

The amorphous silicon layer 206 is disposed on the gate insulating layer 204 to act as a channel with switch function. The ohmic contact layer 208 is disposed on the amorphous silicon layer 206. Furthermore, in an embodiment, pentavalent elements such as arsenic ions, phosphorus ions, or antimony ions, etc. can be doped to form a channel with a high electronic concentration to form ohmic contact.

The drain electrode metal layer 210 is disposed on the ohmic contact layer 208. The source electrode metal layer 212 is disposed on the ohmic contact layer 208, and in an embodiment, the source electrode metal layer 212 is disposed opposite to the drain electrode metal layer 210 on a same surface, and by controlling the gate electrode 202, an electric current flows to the drain electrode metal layer 210 from the source electrode metal layer 212 through the amorphous silicon layer 206.

The protection layer 214 is disposed on the drain electrode metal layer 210 and the source electrode metal layer 212 to protect the thin film transistor 200, and the protection layer 214 includes at least one first protruding part 2141 and at least one first concave part 2142. Therefore, in an embodiment, a top surface of the plurality of thin film transistors 200 may include at least one bump.

One end of each of the pillar-shaped supporting elements 400 is connected to the second substrate 300, and other end of each of the pillar-shaped supporting elements 400 includes at least one second protruding part 4001 and at least one second concave part 4002. The plurality of pillar-shaped supporting elements 400 are disposed on the protection layer 214 of each of the thin film transistors 200. Furthermore, in an embodiment, the pillar-shaped supporting elements 400 include an elastic material, so it can recover to an initial state after being squeezed.

Furthermore, in an embodiment, the second substrate 300 includes a light filter layer 302. The light filter layer 302 includes a red light filter region, a blue light filter region, and a green light filter region, and each of the pillar-shaped supporting elements 400 is formed on the light filter layer 302. In another embodiment, pillar-shaped supporting elements 400 include a photoresist material, so the pillar-shaped supporting elements 400 can be formed on the light filter layer 302 by various semiconductor manufacturing processes such as a coating process, an exposure process, a development process, etc.

The liquid crystal layer 500 is disposed between the first substrate 100 and the second substrate 300 and includes a plurality of liquid crystal molecules 502. Each of the liquid crystal molecules 502 is aligned along a vertical direction that is from a direction of the first substrate 100 toward a direction of the second substrate 300. Therefore, the liquid crystal layer 500 of the anti-stress liquid crystal display structure of the present disclosure has vertical alignment (VA) liquid crystal molecules, but it is not limited thereto. The liquid crystal molecules 502 can be aligned by other method according to an actual requirement, for example, the liquid crystal layer 500 may have twisted nematic (TN) liquid crystal molecules.

Figure 4:
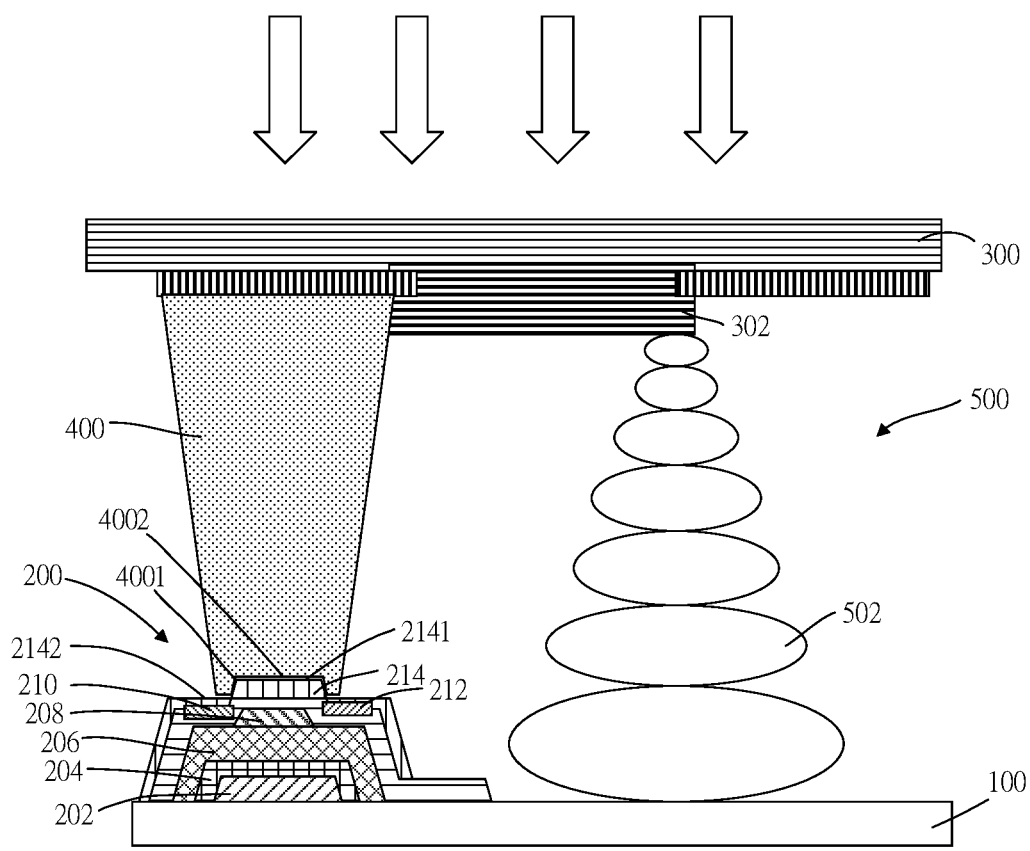
FIG. 4 is a second schematic diagram of the anti-stress liquid crystal display structure of the present disclosure.
Figure 5:
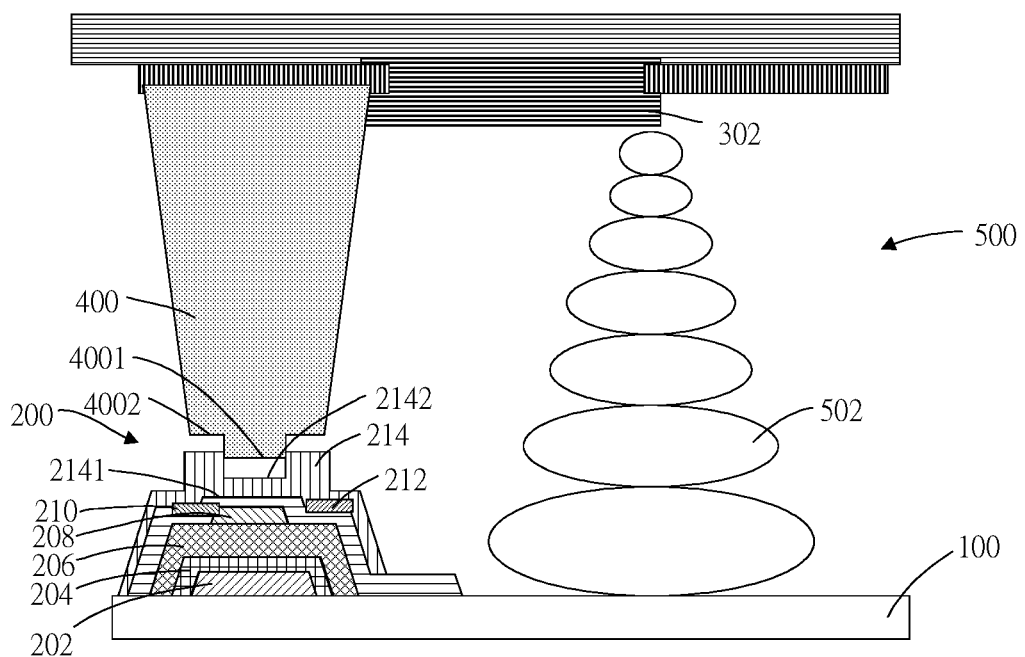
FIG. 5 is a third schematic diagram of the anti-stress liquid crystal display structure of the present disclosure.
Figure 6:
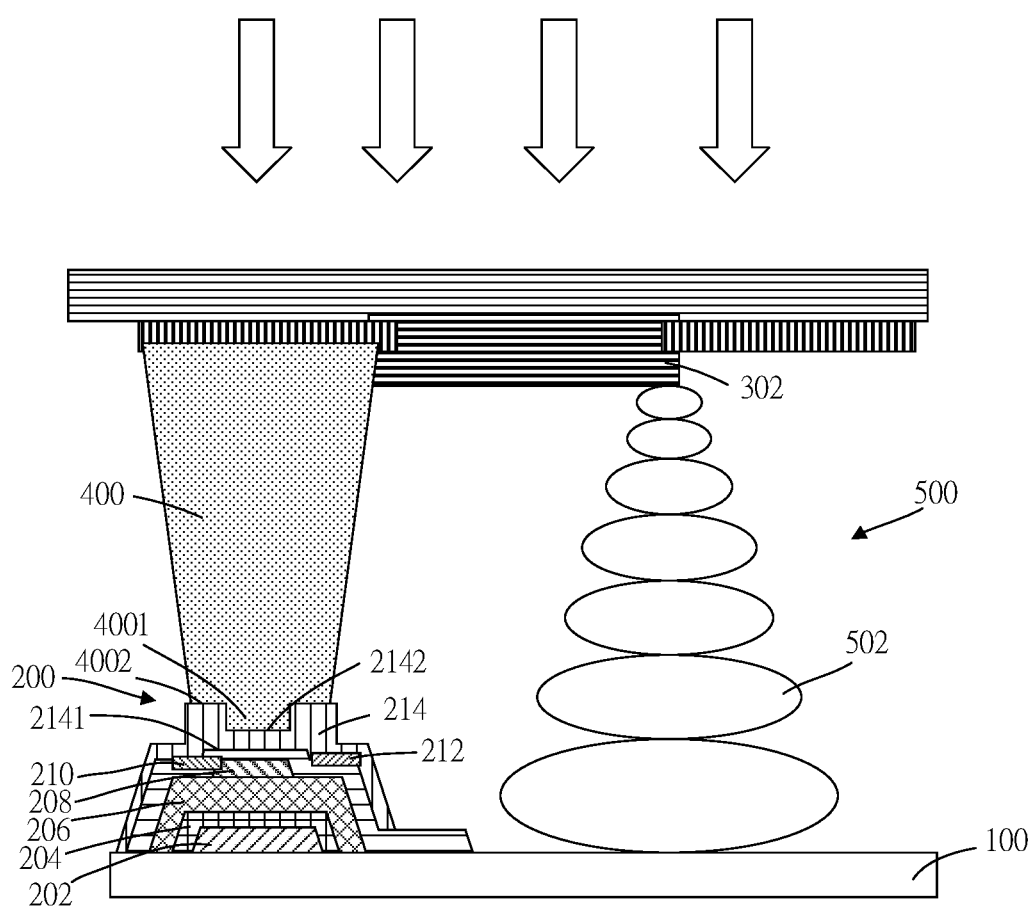
FIG. 6 is a fourth schematic diagram of the anti-stress liquid crystal display structure of the present disclosure.

In an embodiment, when the second substrate 300 receives a stress toward the first substrate 100, each of the pillar-shaped supporting elements 400 is engaged on the protection layer 214. When each of the pillar-shaped supporting elements 400 is engaged on the protection layer 214, as illustrated in FIG. 4 to FIG. 6, each of the first protruding part 2141 and each of the second concave part 4002 contact with each other, and each of the second protruding part 4001 and each of the first concave part 2142 contact with each other.

Therefore, in an embodiment, when continuously tapping a surface of the liquid crystal display, the second substrate 300 would receive stress toward the first substrate 100. However, because each first protruding part 2141 and each second concave part 4002 contact with each other, and each second protruding part 4001 and each first concave part 2142 contact with each other, this makes each pillar-shaped supporting elements 400 is engaged on the protection layer 214. Therefore, diffusion phenomena of the liquid crystal molecules 502 in the liquid crystal layer 500 may be reduced. Moreover, the diffusion of the liquid crystal molecules 502 can recover to the initial state in a short time, for example, in an embodiment, they can recover to the initial state within 5 seconds.

Figure 7:
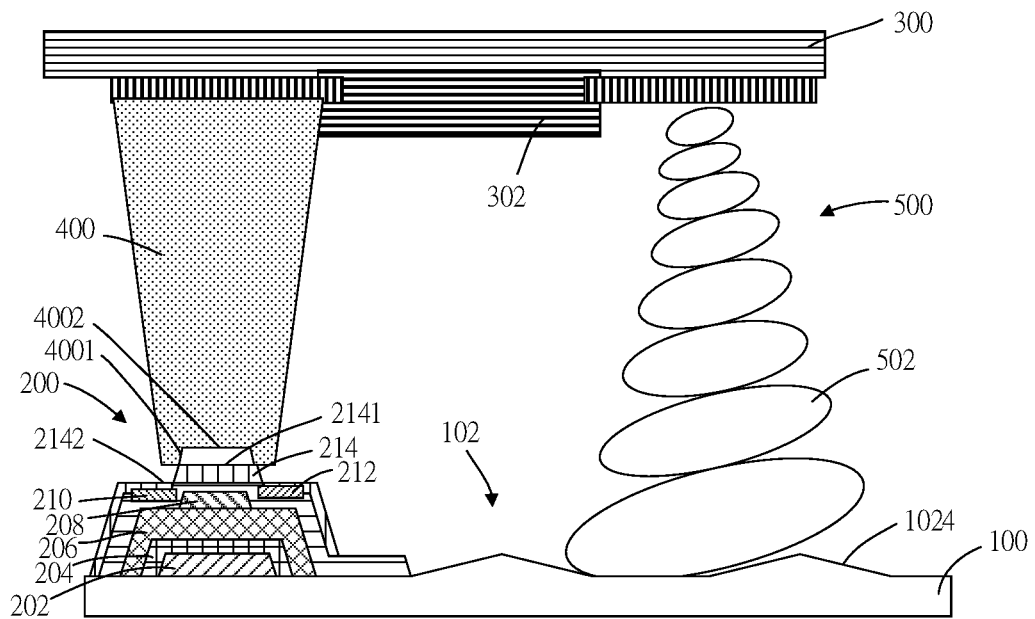
FIG. 7 is a fifth schematic diagram of the anti-stress liquid crystal display structure of the present disclosure.

Please refer to FIG. 7 and with reference with FIG. 3 to FIG. 6, in an embodiment, the first substrate 100 includes an alignment film 102. The alignment film 102 includes a plurality of tilt angles 1024 corresponding to a horizontal direction, and the liquid crystal layer 500 is disposed on the plurality of tilt angles 1024. For example, in an embodiment, the plurality of tilt angles 1024 range from 1 degree to 10 degrees, which can control the arrangement of the liquid crystal molecules 502 in the liquid crystal layer 500 to make image quality of the liquid crystal display be better.

Figure 8:
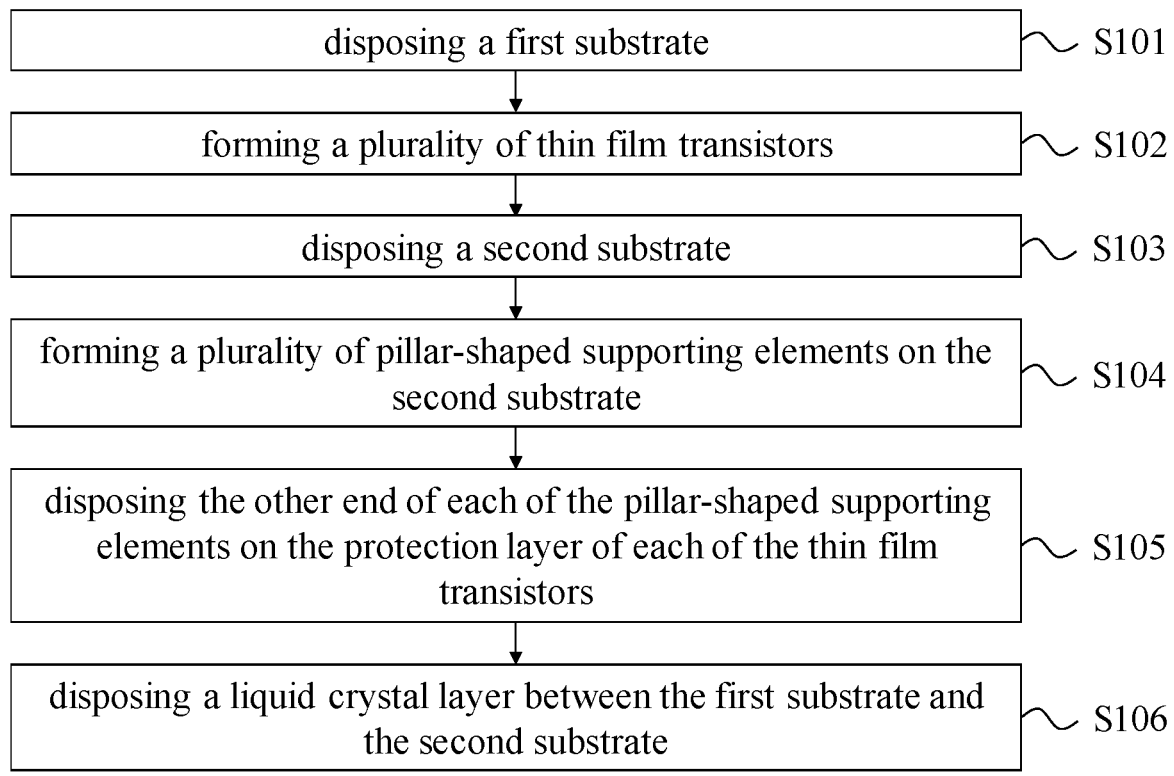
FIG. 8 is a first flowchart of a manufacturing method of the anti-stress liquid crystal display structure of the present disclosure.
Figure 9:
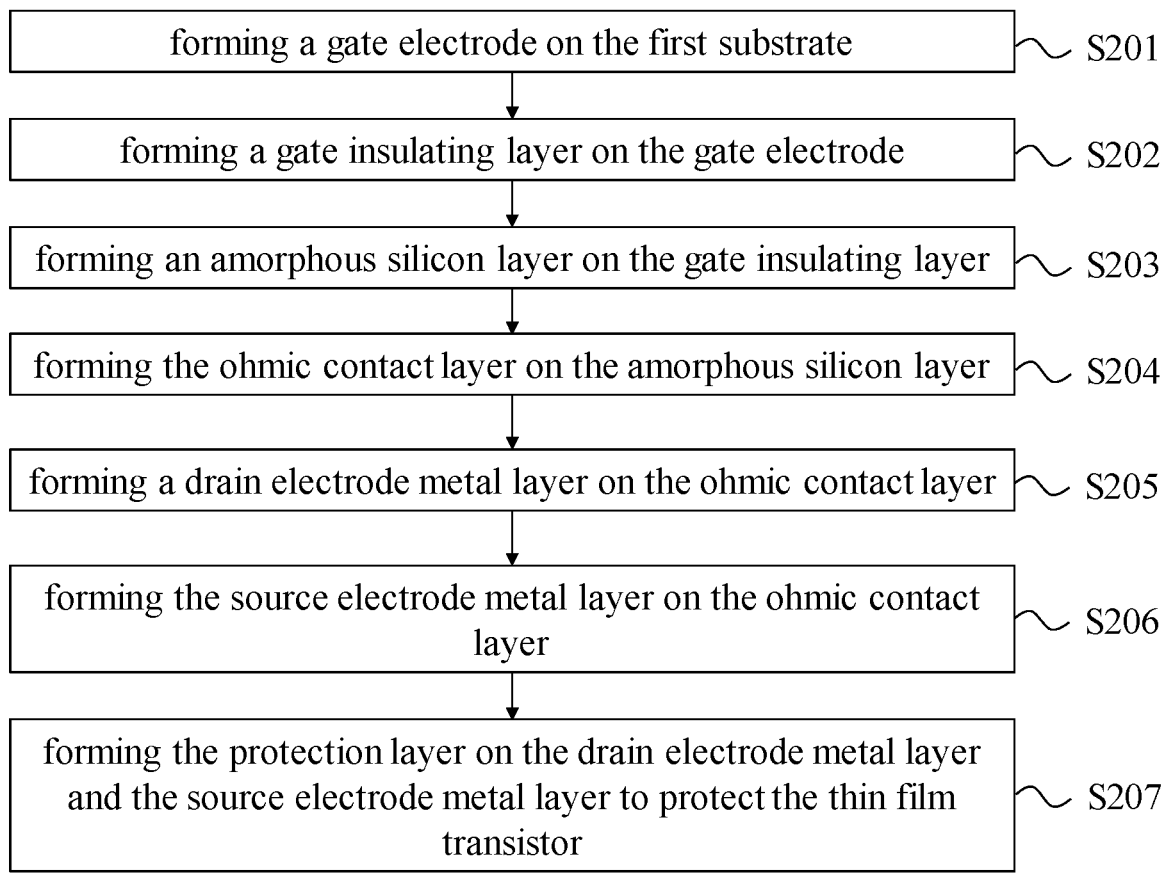
FIG. 9 is a second flowchart of the manufacturing method of the anti-stress liquid crystal display structure of the present disclosure.

Please refer to FIG. 8 to FIG. 9 and with reference with FIG. 3 to FIG. 6, the present disclosure further provides a manufacturing method of the anti-stress liquid crystal display structure, which includes steps as follows:

S101: disposing a first substrate 100. In an embodiment, the first substrate 100 includes polarizers and a transparent material to make light from a backlight source or light of a lateral light source can successfully pass through to provide image quality that is good and with sufficient brightness to a liquid crystal display.

S102: forming a plurality of thin film transistors 200, and forming each of the thin film transistors 200 includes steps as follows:

S201: forming a gate electrode 202 on the first substrate 100 to receive a voltage from the first substrate 100 to control the drain electrode metal layer 210 and the source electrode metal layer 212 to turn on.

S202: forming a gate insulating layer 204 on the gate electrode 202 to reduce a leakage current.

S203: forming an amorphous silicon layer 206 on the gate insulating layer 204. The amorphous silicon layer 206 acts as a channel with switch function.

S204: forming the ohmic contact layer 208 on the amorphous silicon layer 206. Furthermore, in an embodiment, pentavalent elements such as arsenic ions, phosphorus ions, or antimony ions, etc. can be doped to form a channel with a high electronic concentration to form ohmic contact.

S205: forming a drain electrode metal layer 210 on the ohmic contact layer 208.

S206: forming the source electrode metal layer 212 on the ohmic contact layer 208. In an embodiment, the source electrode metal layer 212 is disposed opposite to the drain electrode metal layer 210 on a same surface, and by controlling the gate electrode 202, an electric current flows to the drain electrode metal layer 210 from the source electrode metal layer 212 through the amorphous silicon layer 206.

S207: forming the protection layer 214 on the drain electrode metal layer 210 and the source electrode metal layer 212 to protect the thin film transistor 200. The protection layer 214 includes at least one first protruding part 2141 and at least one first concave part 2142. In an embodiment, the manufacturing method further includes using an etching approach to form each of the first protruding part 2141 and each of the first concave part 2142 on the protection layer 214.

S103: disposing a second substrate 300. Furthermore, in an embodiment, the second substrate 300 includes polarizers and a transparent material to make light from a backlight source or light of a lateral light source can successfully pass through to provide image quality that is good and with sufficient brightness to a liquid crystal display.

S104: forming a plurality of pillar-shaped supporting elements 400 on the second substrate 300. Furthermore, one end of each of the pillar-shaped supporting elements 400 is connected to the second substrate 300, and other end of each of the pillar-shaped supporting elements 400 includes at least one second protruding part 4001 and at least one second concave part 4002. In an embodiment, the manufacturing method further includes after forming each of the pillar-shaped supporting elements 400, using an etching approach to form each of the second protruding part 4001 and each of the second concave part 4002.

S105: disposing the other end of each of the pillar-shaped supporting elements 400 on the protection layer 214 of each of the thin film transistors 400.

S106: disposing a liquid crystal layer 500 between the first substrate 100 and the second substrate 300. The liquid crystal layer 500 includes a plurality of liquid crystal molecules 502. Each of the liquid crystal molecules 502 is aligned along a vertical direction that is from a direction of the first substrate 100 toward a direction of the second substrate 300.

Furthermore, in the step S207 and the step S104, not only can use an etching process can form each first protruding part 2141, each first concave part 2142, each second protruding part 4001, but each second concave part 4002, various semiconductor manufacturing processes such as a coating process, an exposure process, a development process, etc. may also be included to form each first protruding part 2141, each first concave part 2142, each second protruding part 4001, and each second concave part 4002.

In an embodiment, when the second substrate 300 receives a stress toward the first substrate 100, each of the pillar-shaped supporting elements 400 is engaged on the protection layer 214. When each of the pillar-shaped supporting elements 400 is engaged on the protection layer 214, as illustrated in FIG. 4 to FIG. 6, each of the first protruding part 2141 and each of the second concave part 4002 contact with each other, and each of the second protruding part 4001 and each of the first concave part 2142 contact with each other.

Therefore, in an embodiment, when continuously tapping a surface of the liquid crystal display, the second substrate 300 would receive stress toward the first substrate 100. However, because each first protruding part 2141 and each second concave part 4002 contact with each other, and each second protruding part 4001 and each first concave part 2142 contact with each other, this makes each pillar-shaped supporting elements 400 is engaged on the protection layer 214. Therefore, diffusion phenomena of the liquid crystal molecules 502 in the liquid crystal layer 500 may be reduced. Moreover, the diffusion of the liquid crystal molecules 502 can recover to the initial state in a short time, for example, in an embodiment, they can recover to the initial state within 5 seconds.

Therefore, in summary, the anti-stress liquid crystal display structure and the manufacturing method thereof provided by the present disclosure, which can use protruding parts and concave parts of pillar-shaped supporting elements 400 and thin film transistors 200 to engage with each other to prevent from the pillar-shaped supporting elements shifting during the panel being squeezed.

Although the disclosure has been shown and described with respect to one or more implementations, equivalent alterations and modifications will occur to others skilled in the art based upon a reading and understanding of this specification and the annexed drawings. The disclosure includes all such modifications and alterations, and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such features may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising".

The above are preferred embodiments of the present disclosure. It should be noted that those skilled in the art can further make many changes and modifications without departing from the technical theory of the present disclosure, and the changes and the modifications should be considered as the scope of protection of the present disclosure.

What is claimed is:

1. An anti-stress liquid crystal display structure, comprising:
  a first substrate;
  a plurality of thin film transistors, comprising:
  a gate electrode disposed on the first substrate;
  a gate insulating layer disposed on the gate electrode;
  an amorphous silicon layer disposed on the gate insulating layer;
  an ohmic contact layer disposed on the amorphous silicon layer;
  a drain electrode metal layer disposed on the ohmic contact layer;
  a source electrode metal layer disposed on the ohmic contact layer; and
  a protection layer disposed on the drain electrode metal layer and the source electrode metal layer, wherein the protection layer comprises at least one first protruding part and at least one first concave part;
  a second substrate;
  a plurality of pillar-shaped supporting elements, wherein one end of each of the pillar-shaped supporting elements is connected to the second substrate, and other end of each of the pillar-shaped supporting elements comprises at least one second protruding part and at least one second concave part, the at least one second protruding part is directly above the at least one first concave part, the at least one second concave part is directly above the at least one first protruding part, a first gap is between the at least one second protruding part and the at least one first concave part, a second gap is between the at least one second concave part and the at least one first protruding part, a width of a top surface of the first protruding part is equal to a width of a bottom of the second concave part, a protruding height of the first protruding part is equal to a concave depth of the second concave part, and a cross-sectional shape of the first protruding part is same as a cross-sectional shape of the second concave part; and a liquid crystal layer disposed between the first substrate and the second substrate and comprising a plurality of liquid crystal molecules, wherein each of the liquid crystal molecules is aligned along a vertical direction that is from a direction of the first substrate toward a direction of the second substrate.

2. The anti-stress liquid crystal display structure as claimed in claim 1, wherein the first substrate comprises an alignment film, the alignment film includes a plurality of tilt angles corresponding to a horizontal direction, and the liquid crystal layer is disposed on the plurality of tilt angles.

3. The anti-stress liquid crystal display structure as claimed in claim 1, wherein the plurality of pillar-shaped supporting elements comprise an elastic material or a photoresist material.

4. The anti-stress liquid crystal display structure as claimed in claim 1, wherein the first substrate and the second substrate comprise polarizers and a transparent material.

5. The anti-stress liquid crystal display structure as claimed in claim 1, wherein a top surface of the plurality of thin film transistors comprises at least one bump.

6. The anti-stress liquid crystal display structure as claimed in claim 1, wherein the second substrate comprises a light filter layer.

7. The anti-stress liquid crystal display structure as claimed in claim 6, wherein the light filter layer comprises a red light filter region, a blue light filter region, and a green light filter region.

8. The anti-stress liquid crystal display structure as claimed in claim 6, wherein each of the pillar-shaped supporting elements is disposed on the light filter layer.

9. A manufacturing method of an anti-stress liquid crystal display structure, comprising:
    disposing a first substrate;
    forming a plurality of thin film transistors, wherein forming each of the thin film transistors comprises:
    forming a gate electrode on the first substrate;
    forming a gate insulating layer on the gate electrode;
    forming an amorphous silicon layer on the gate insulating layer;
    forming an ohmic contact layer on the amorphous silicon layer;
    forming a drain electrode metal layer on the ohmic contact layer;
    forming a source electrode metal layer on the ohmic contact layer; and
    forming a protection layer on the drain electrode metal layer and the source electrode metal layer, wherein the protection layer comprises at least one first protruding part and at least one first concave part;
    disposing a second substrate;
    forming a plurality of pillar-shaped supporting elements on the second substrate, wherein one end of each of the pillar-shaped supporting elements is connected to the second substrate, and other end of each of the pillar-shaped supporting elements comprises at least one second protruding part and at least one second concave part;
    disposing the other end of each of the pillar-shaped supporting elements on the protection layer of each of the thin film transistors, wherein the at least one second protruding part is directly above the at least one first concave part, the at least one second concave part is directly above the at least one first protruding part, a first gap is between the at least one second protruding part and the at least one first concave part, a second gap is between the at least one second concave part and the at least one first protruding part, a width of a top surface of the first protruding part is equal to a width of a bottom of the second concave part, a protruding height of the first protruding part is equal to a concave depth of the second concave part, and a cross-sectional shape of the first protruding part is same as a cross-sectional shape of the second concave part; and
    disposing a liquid crystal layer between the first substrate and the second substrate, wherein the liquid crystal layer comprises a plurality of liquid crystal molecules, and each of the liquid crystal molecules is aligned along a vertical direction that is from a direction of the first substrate toward a direction of the second substrate.

10. The manufacturing method of the anti-stress liquid crystal display structure as claimed in claim 9, wherein the manufacturing method comprises after forming each of the pillar-shaped supporting elements, using an etching approach to form each of the second protruding part and each of the second concave part.

11. The manufacturing method of the anti-stress liquid crystal display structure as claimed in claim 9, wherein the manufacturing method comprises using an etching approach to form each of the first protruding part and each of the first concave part on the protection layer.

12. The manufacturing method of the anti-stress liquid crystal display structure as claimed in claim 9, wherein the first substrate includes an alignment film, the alignment film includes a plurality of tilt angles corresponding to a horizontal direction, and the liquid crystal layer is disposed on the plurality of tilt angles.

13. The manufacturing method of the anti-stress liquid crystal display structure as claimed in claim 9, wherein the plurality of pillar-shaped supporting elements comprise an elastic material or a photoresist material.

14. The manufacturing method of the anti-stress liquid crystal display structure as claimed in claim 9, wherein the first substrate and the second substrate comprise polarizers and a transparent material.

15. The manufacturing method of the anti-stress liquid crystal display structure as claimed in claim 9, wherein a top surface of the plurality of thin film transistors comprises at least one bump.

16. The manufacturing method of the anti-stress liquid crystal display structure as claimed in claim 9, wherein the second substrate comprises a light filter layer, the light filter layer comprises a red light filter region, a blue light filter region, and a green light filter region, and each of the pillar-shaped supporting elements is formed on the light filter layer.

* * * * *